US006250540B1

United States Patent
Egitto et al.

(10) Patent No.: US 6,250,540 B1
(45) Date of Patent: *Jun. 26, 2001

(54) FLUXLESS JOINING PROCESS FOR ENRICHED SOLDERS

(75) Inventors: Frank D. Egitto, Binghamton; Luis J. Matienzo, Endicott, both of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/302,740

(22) Filed: Apr. 30, 1999

(51) Int. Cl.$^7$ .............................. B23K 1/00; B23K 1/20; B23K 31/02

(52) U.S. Cl. .......................... 228/205; 228/42; 228/219; 219/85.21

(58) Field of Search ........................... 228/205, 42, 219; 219/85.21

(56) References Cited

U.S. PATENT DOCUMENTS

| 4,064,030 | | 12/1977 | Nakai et al. ...................... 204/192 E |
| 4,921,157 | * | 5/1990 | Dishon et al. ......................... 228/124 |
| 5,000,819 | * | 3/1991 | Pedder et al. ......................... 156/643 |
| 5,054,421 | * | 10/1991 | Ito et al. ............................... 118/723 |
| 5,108,950 | * | 4/1992 | Wakabayashi et al. ............... 437/183 |
| 5,188,280 | * | 2/1993 | Nakao et al. .......................... 228/123 |
| 5,192,582 | * | 3/1993 | Liedke et al. ......................... 228/206 |
| 5,244,144 | * | 9/1993 | Osame et al. ......................... 228/219 |
| 5,340,411 | | 8/1994 | Mergele et al. ........................ 148/26 |
| 5,345,056 | * | 9/1994 | Frei et al. ......................... 219/121.59 |
| 5,476,726 | * | 12/1995 | Harada et al. ......................... 428/643 |
| 5,499,754 | * | 3/1996 | Bobbio et al. .......................... 228/42 |
| 5,516,031 | * | 5/1996 | Nishikawa et al. .................... 228/205 |
| 5,609,290 | * | 3/1997 | Bobbio et al. ......................... 228/206 |
| 5,634,268 | | 6/1997 | Dalal et al. ............................. 29/840 |
| 5,729,896 | | 3/1998 | Dalal et al. ............................. 29/840 |
| 5,735,451 | * | 4/1998 | Mori et al. ............................ 228/206 |
| 5,878,943 | * | 3/1999 | Nishikawa et al. .................... 228/205 |
| 5,933,752 | * | 8/1999 | Yanagida .............................. 438/613 |
| 6,056,831 | * | 5/2000 | Egitto et al. .......................... 148/241 |
| 6,092,714 | * | 3/1999 | Casey ................................... 228/205 |

FOREIGN PATENT DOCUMENTS 6-53639   2/1994   (JP) .

OTHER PUBLICATIONS

U.S. application No. 09/382,221, Egitto et al., filed Aug. 24, 1999.

Nishikawa et al., "Fluxless Soldering Process Technology," IEEE, 1994 Elec. Components and Tech. Conf. pp. 286–292.

Herdzik et al., "Lift–Off Process for CrCuAu Metallurgy," IBM Technical Disclosure Bulletin, vol. No. 1, Jun. 1979, pp. 84–85.

Dimigen et al, "Influence of Mask Materials on Ion–Etched Structrues," Journal of Vacuum Scienct Tech., vol. 13, No. 4, Aug. 1976, pp. 976–980.

(List continued on next page.)

*Primary Examiner*—Tom Dunn
*Assistant Examiner*—L. Edmondson
(74) *Attorney, Agent, or Firm*—Ratner & Prestia; Lawrence R. Fraley, Esq.

(57) ABSTRACT

A process for promoting fluxless soldering of a mass of bulk solder having a bulk ratio of a first metal to a second metal, such as lead-enriched solder that has significantly more lead than tin. The process comprises exposing the bulk solder to energized ions of a sputtering gas in the presence of a halogen, such as fluorine, and forming a surface layer having a desired surface layer ratio of the first to the second metal that is less than the bulk ratio, the surface layer further comprising an uppermost surface film containing the fluorine or other halogen. After the solder exposure and surface-layer formation, the process may further comprise electrically joining the solder to a surface without using externally-applied flux. This process enables the joining step to be performed at less than 300° C., at approximately 180° C.

20 Claims, 4 Drawing Sheets

OTHER PUBLICATIONS

"Thin Film Processes" by J.L. Vossen et al. 1978, pp. 14–19.

"Ion Milling to Remove Halo" by RJ Herdzik et al. IBM Tech. Disc. Bulletin vol. 23, No. 11, Apr., 1981.

"Ion beam joining technique" by JME Harper et al. J. Vac. Sci. Tech. 20(3), Mar., 1982. pp. 359–363.

"Surface Reactions of Copper Films in O2/CF4/N2 Plasmas" by DD Coolbaugh et al. Surface and Interface Analysis vol. 15, No. 2, Feb., 1990. pp. 119–124.

"Fluxless, no clean solder processing of components, printed wiring boards, and packages in air and nitrogen." by N. Koopman et al. Proc. Surface Mount Int'l Conf., San Jose, CA 1995, pp. 437–446.

"Ion Milling Technique to Reflow Solder Pads" by RJ Herdzik et al. IBM Technical Disclosure Bulletin Apr., 1981. pp. 4915–4916.

Koopman et al., "Fluxless, no clean solder processing of components, printed wiring boards, and packages in air and nitrogen", Proc. Surface Mount Int'l Conf., pp. 437–446, 1995.*

Koopman et al., "Fluxless, no clean solder processing of components, printed wiring boards, and packages in air and nitrogen", Proc. Surface Mount Int'l Conf., pp. 437–446, 1995.*

Koopman et al., Fluxless, no clean assembly of solder bumped flip chips, IEEE, 1996 Elec. Components and Tech. Conf., pp. 552–558, 1996.*

Harper et al., "Ion beam joining technique", J. Vac. Sci. Tech. 20(3), pp. 359–363, Mar. 1982.*

Coolbaugh et al., "Surface reactions of copper films in O2/CF4/N2 plasmas", Surface and Interface Analysis. 15(2), pp. 119–124, Feb. 1990.*

* cited by examiner

FLUXLESS JOINING PROCESS FOR ENRICHED SOLDERS

TECHNICAL FIELD

The present invention relates generally to a process for preparing a solder surface for joining and, more specifically, to a process for enhancing surface properties of solder used in microelectronics to allow electrical joining without the need for externally applied organic flux.

BACKGROUND OF THE INVENTION

In the manufacture of microelectronic devices, various microelectronic components are electrically joined together into circuits using metal alloy solders. Such solders are generally alloys of lead (Pb) and tin (Sn), but can comprise other metal components. The metal alloy solder is generally optimized for bulk properties that control the thermal behavior of the solder. For example, the melting temperature of Pb/Sn solder is controlled by adjusting the relative amounts of tin and lead in the solder. The minimum melting temperature of a Pb/Sn alloy is achieved when the ratio by weight of Pb to Sn in the solder is 37:63. This is called the eutectic composition.

For some applications, it is desirable to use bulk solder alloys at other than the eutectic composition. For example, Controlled Collapse Chip Connection (C4) solder balls on Integrated Circuit (IC) chips, which are used to join the chips to chip carriers, are typically Pb-rich in the range of 90% to 97% Pb. Because Pb-enriched solders have higher melting temperatures than solders at or nearer the eutectic composition, the solder joint between the chip and the chip carrier maintains its shape throughout subsequent assembly of the chip carrier (with chip attached) to another electrical component such as a printed circuit board. The Pb-enriched solders also typically require higher temperatures, however, to fuse them to metal surfaces such as copper pads on chip carriers. Thus, organic laminate chip carriers having copper joining pads may be exposed to undesirable high temperatures during joining processes.

Such Pb-enriched solders may also be poorly suited for surface treatment to promote fluxless soldering. One fluxless soldering process is known as Plasma-Assisted Dry Soldering (PADS). In the PADS process, solder is treated in a plasma environment containing fluorine atoms to produce a surface that does not require the use of organic solder flux to remove metal oxides before electrically joining a chip to a chip carrier.

All metal solder surfaces typically oxidize when exposed to ambient oxygen in the air, forming a metal oxide layer on the surface of the solder. Flux is an organic acid typically externally applied to a solder surface before a fusing step. The flux reacts with the metal oxide layer when heated, thus converting the metal oxides to salts and exposing the underlying solder metal so that it may be fused to another metal surface. Fluorine treatment is thought to react with the metal oxides to form hydrolytically unstable metal oxyfluoride compounds on the solder surface. Upon heating, the metal oxyfluoride compounds hydrolyze, most likely to hydrogen fluoride that converts the oxides to salts in the same way that the flux does.

For Pb/Sn solders, it has been demonstrated that fluorine atoms react preferentially with the Sn oxides. Thus, fluorine treatment is not as effective for solder compositions that are "too rich" in Pb, such as commonly used 97:3 Pb:Sn solder. So, for instance, although fluxless soldering of 90:10 Pb:Sn alloy solder has been achieved previously after exposure of the solder to fluorine atoms, it has only been accomplished at temperatures above 300° C., beyond the desired temperature range for the organic laminate chip carriers.

Thus, a need remains for a process that enables fluxless soldering of Pb-enriched solders at temperatures less than 300° C.

SUMMARY OF THE INVENTION

To meet this and other needs, and in view of its purposes, the present invention provides a process for promoting fluxless soldering of a mass of bulk solder having a bulk ratio of a first metal to a second metal, such as a lead-enriched solder comprising significantly more lead than tin. The process comprises exposing the bulk solder to energized ions of a sputtering gas in the presence of a halogen, such as fluorine, for a predetermined time period and forming a surface layer having a desired depth and comprising a surface layer ratio of the first metal to the second metal that is less than the bulk ratio. The surface layer further comprises an uppermost surface film containing the halogen.

The process may comprise exposure to sputtering gas, such as a noble gas, in a halogen-containing ambient, or the sputtering gas itself may comprise a halogen, such as fluorine. The sputtering gas may instead be a fluorine or other halogen-containing plasma, such as a reactive ion etching (RIE) plasma. Thus, one embodiment of the invention comprises a process for preparing a mass of lead-enriched bulk solder for fluxless soldering, the process comprising placing the bulk solder on an electrode of a reactive ion etching device and exposing the solder to a halogen-containing plasma.

After the solder exposure and surface-layer forming steps, the process may further comprise electrically joining the solder to a surface without using externally applied flux. The joining step may be conducted at a temperature of less than about 300° C., such as at approximately 180° C.

It is to be understood that both the foregoing general description and the following detailed description are exemplary, but are not restrictive, of the invention.

BRIEF DESCRIPTION OF DRAWING

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following figures.

DETAILED DESCRIPTION OF INVENTION

Co-pending U.S. patent application Ser. No. 09/113,445, assigned to the common assignee of this invention, and incorporated herein by reference, describes a process for bombardment of solder with energetic ions to remove Pb from solder at a higher rate than removal of Sn. Such bombardment results in a surface layer having an enhanced Sn concentration to promote soldering at a low melt-temperature, while maintaining the high melt-temperature properties in the bulk solder. The inventors have also found that performing such a Sn-enrichment process on a 90:10 Pb:Sn bulk ratio solder in the presence of a halogen, such as fluorine, results in a surface that is amenable to fluxless joining at 180° C., well below the melting point of the 90:10 bulk ratio alloy, and below the 300° C. melting point demonstrated for previous fluorine surface treatments of 90:10 alloy solders.

Figure 1A:
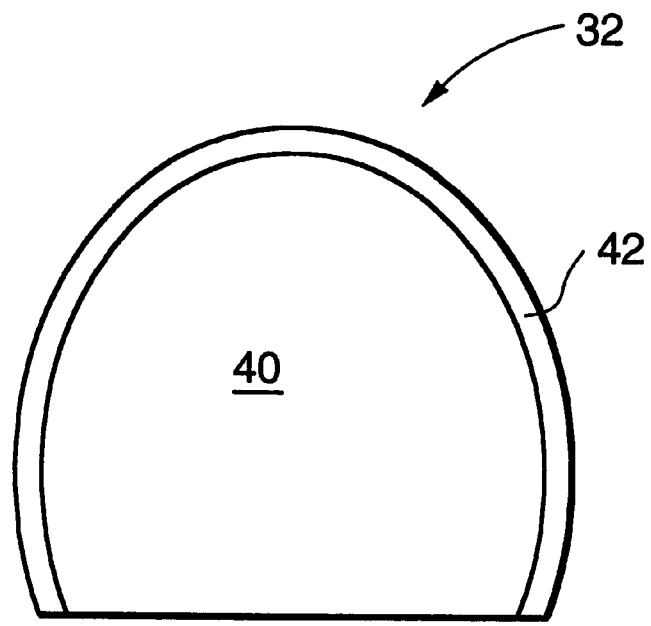
FIG. 1A is a side view cross-sectional schematic illustration of a portion of a mass of solder, showing a homogenous bulk mixture throughout.
Figure 1B:
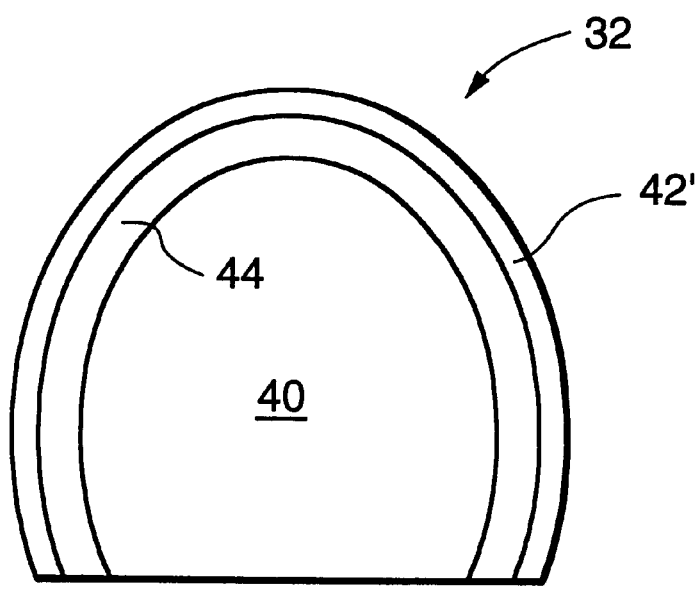
FIG. 1B is a side view cross-sectional schematic illustration of the same portion of the solder mass shown in FIG. 1A, showing the impact of surface layer modification via ion bombardment in the presence of a halogen such as fluorine.

Referring now to the drawing, wherein like reference numerals refer to like elements throughout, FIGS. 1A and 1B show schematic illustrations of a portion of a metal alloy solder 32. This particular metal alloy solder 32 is shown in FIG. 1A comprising a bulk 40 having a homogenous Pb/Sn bulk ratio composition throughout. For example, the bulk ratio may be 90:10 Pb:Sn, meaning that 90% of the mass of the solder is Pb and 10% is Sn. Surface film 42 of metal alloy solder 32 typically comprises metal oxides that need to be removed before soldering.

The process of the present invention comprises altering the surface properties of the metal alloy solder 32 by sputtering in the presence of a halogen, such as fluorine. The process comprises exposing the metal alloy solder 32 for a sufficient, predetermined time period to energized ions of a sputtering gas in the presence of the halogen (e.g., fluorine). Such exposure forms a surface layer having a desired depth on the metal alloy solder 32 with a ratio of tin to lead that is less than the bulk ratio and free of metal oxides.

FIG. 1B shows the resulting metal alloy solder 32 after the process of the present invention has been performed. Most of bulk 40 still retains the original bulk ratio, but a surface layer 44 has been created having a Sn-enriched bulk ratio. Furthermore, surface film 42', comprising the uppermost region of surface layer 44, now comprises the halogen, such as fluorine, in a layer of metal oxyfluorides. Surface layer 44 may become Sn-enriched approaching the same ratio as a eutectic alloy (approximately 3:1 Sn atoms to Pb atoms), while the remainder of the bulk 40 of metal alloy solder 32 is unchanged. Fluorinated or otherwise halogenated surface film 42' is hydrolytically unstable, and allows metal alloy solder 32 to be fused to another metal surface without the need for organic flux, as described above.

The terms "layer" or "film" relate to regions in the metal alloy solder 32 having certain properties, such as being Sn-enriched or being halogenated. For convenience, such regions are illustrated in FIGS. 1A and 1B as being well-defined regions. Such regions are not likely, however, to be discrete, homogenous layers. Rather, the regions are likely layers comprising transitional gradients. For instance, halogenated surface film 42' may include the exposed surface and penetrate through to some depth at which further penetration yields no more halogen ions, the lower region of such layer not being nearly as concentrated as the upper region. Similarly, Sn-enriched surface layer 44 may have a greater Sn enrichment at and closest to the surface than is present closest to the bulk solder. The terms "layer" and "film" include such non-homogenous, transition regions that form a gradient from the highest concentration to the minimally present concentration of the designated property.

The change in surface layer 44 composition to a higher Sn concentration promotes a lower melting temperature, and the incorporation of fluorine or another halogen in surface film 42' enables lower temperature fusing operations without flux. The bulk solder feature still maintains its shape, however, during high temperature processing such as joining of chips to chip carriers and chip carriers to printed circuit boards.

The fluorine or other halogen used to remove metal oxides in the process of the present invention may be introduced in one of at least two ways. The solder may be irradiated with an ion beam in a fluorine or other halogen-containing ambient, or the solder may be exposed to a fluorine or other halogen-containing plasma in which the sample is bombarded by energetic ions from the plasma, such as in a reactive ion etching configuration. Noble gases such as argon are typically used for sputtering applications, and thus are also suitable for generating an ion beam when used in a fluorine or other halogen-containing ambient. When the fluorine or other halogen-containing plasma is used, the halogen gas, such as fluorine, is introduced to the sputtering application directly into an ion gun or other plasma generator along with the inert gas.

Figure 2:
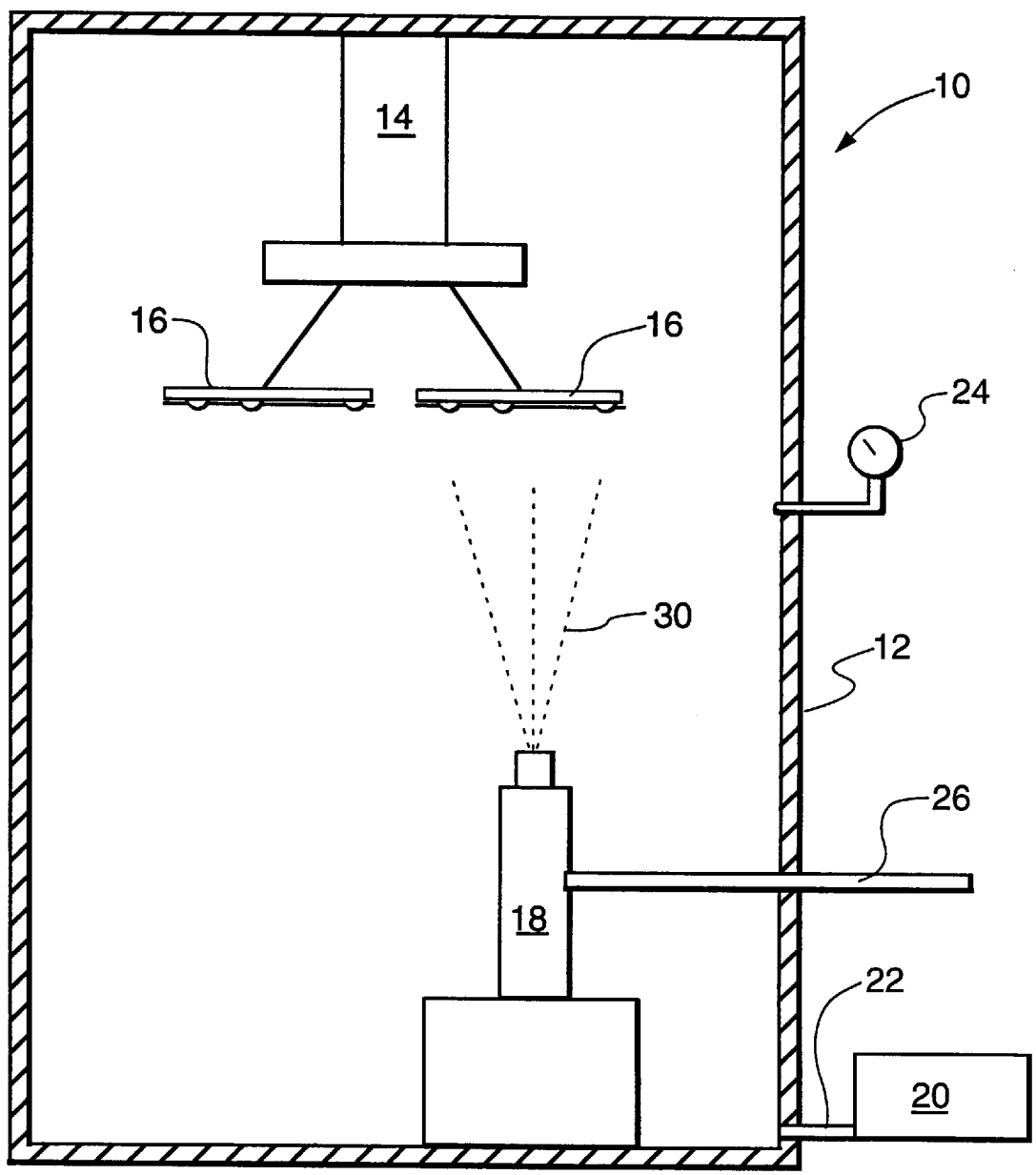
FIG. 2 is a side view schematic illustration of an exemplary ion-gun apparatus for conducting the present invention.

Referring now to FIG. 2, there is shown an exemplary sputtering apparatus 10 that may be used with the process of the present invention to modify the surface properties of a metal alloy solder 32 by ion bombardment in the presence of a halogen, such as fluorine, to promote fluxless soldering. Vacuum chamber 12 contains a holder 14, for holding substrates 16, and an ion gun 18. As shown in FIG. 2, ion gun 18 directs an ion beam 30 in a fixed position at substrates 16 mounted upside-down on holder 14, while the holder 14 moves the substrates 16 in and out of the beam 30. Holder 14 as shown in FIG. 2 is a planetary motion device such as that commonly used in chemical vapor deposition (CVD) systems and well known in the art.

A vacuum pump 20 is provided to evacuate vacuum chamber 12 via vacuum hose 22. A vacuum gauge 24 may indicate the amount of vacuum inside the chamber 12. Sputtering gas is supplied to the ion gun 18 via gas tubing 26. Suitable materials of construction for vacuum chamber 12 typically comprise aluminum, stainless steel, quartz, chemical and temperature resistant glass, or the like.

In operation of apparatus 10, vacuum pump 20 evacuates the vacuum chamber 12 and sputtering gas is supplied to ion gun 18 through gas tubing 26. A plasma (not shown) is generated within the ion gun 18, in which a voltage grid (not shown) extracts ions from the plasma and accelerates them out of the gun 18 in a directed ion beam 30 that bombards substrates 16 with ions. The amount of exposure time necessary to modify the solder surface depends on the size and strength of the beam 30, the desired depth of modification, and the surface area of the sample to be treated, and can vary from a fraction of a minute to approximately an hour. The sputtering gas may contain a halogen, such as fluorine, or the sputtering gas may be an inert gas in combination with a halogenated atmosphere within vacuum chamber 12 as a result of a halogen, such as fluorine, introduced through an external piping connection (not shown).

Figure 3:
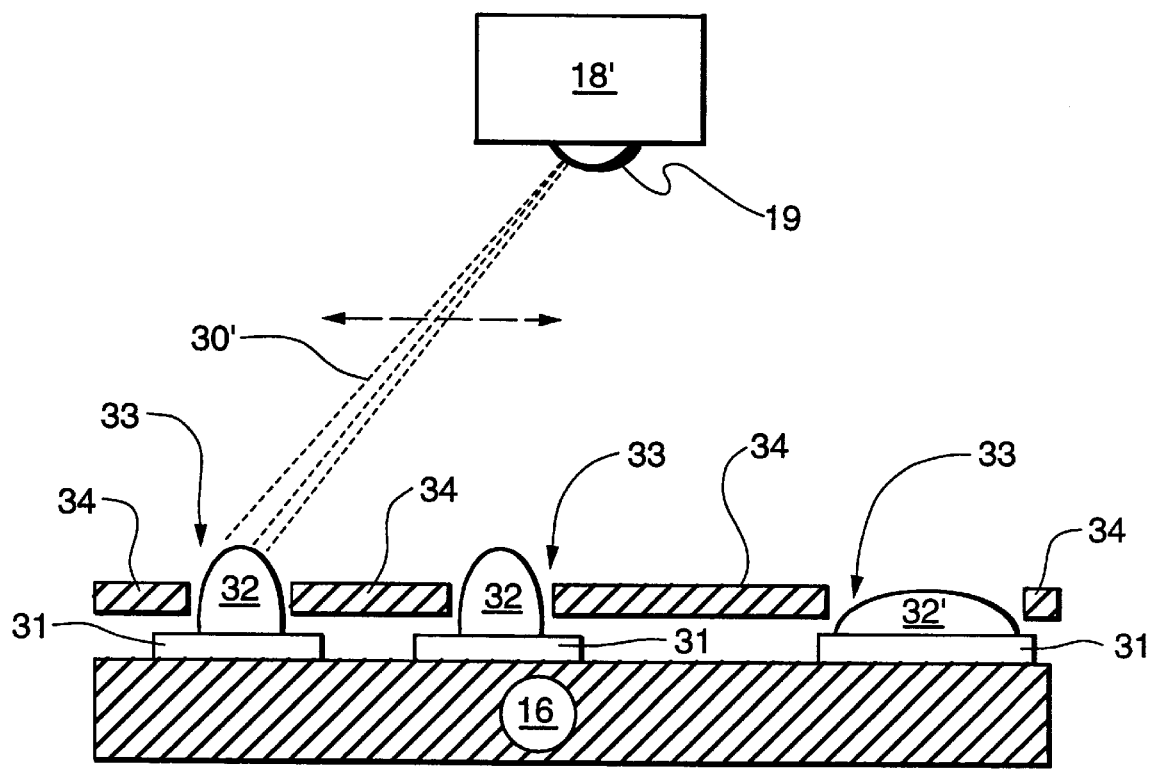
FIG. 3 is a side view schematic illustration of an alternate ion gun embodiment of the present invention being used on a substrate shown right-side-up in cross-section.

Referring now to FIG. 3, there is shown a cross-sectional side view of a right-side-up substrate 16 and an alternate type of ion gun 18'. Substrate 16 typically is made of a polyamide-, polyimide-, polyester-, or polyethylene-based material or some other organic composition, but may also be made of an inorganic material such as $SiO_2$, $Si_3N_4$, and the like. Substrate 16 has a plurality of metal joining pads 31 on its surface. Metal joining pads 31 are preferably made of copper.

On each of metal joining pads 31 is deposited a mass of functional metal alloy solder 32 or of process control solder 32'. Process control solder 32' is a test feature deposited on the substrate 16 solely for the purpose of process control. Process control solder 32' has an area sufficiently large and flat to be analyzed by Auger Electron Spectrometry (AES), X-ray Photoelectron Spectroscopy (XPS), or other conventional surface analytical techniques. Such analysis is used to evaluate the solder surface to assess the results of the ion bombardment process.

A mask 34 is placed over substrate 16 to shield from ion beam 30' those portions of the substrate 16 not intended for bombardment with ions. The use of a mask 34 is especially important when exposure to ion beam irradiation is detrimental to the performance of the material surrounding the solder-coated areas. A mask 34 may be omitted if it is desired to simultaneously modify the substrate surface by ion bombardment while the solder surface is modified. When no substrate modification is desired, the mask 34 may cover all of the substrate 16 except the solder masses. As shown in FIG. 3, mask 34 exposes only solder masses 32 and 32' through apertures 33. Alternatively, the mask 34 may cover only the portions of the substrate 16 or attached features sensitive to and not intended for bombardment.

The composition of the mask 34 is important. To extend the useful life of the mask 34 and to avoid generation of potential contamination of the substrate 16 by sputtered fragments from the mask 34, mask erosion must be avoided. This objective is best accomplished by use of a mask material having a sputtering yield far lower than that of the element to be preferentially sputtered from the alloy being modified. For example, for enrichment of Sn on the surface of Pb-Sn alloys, molybdenum, titanium, and zirconium are desirable mask materials. For ease of mask fabrication, molybdenum is preferred.

Ion gun 18' shown in FIG. 3 has a head 19 capable of directing a rastered ion beam 30' that can be directed across stationary substrate 16. A rastered beam essentially moves in a line (shown in FIG. 3) from side-to-side of the substrate 16 starting from one edge, and indexing the width of the beam in a direction perpendicular to the side-to-side motion between each side-to-side pass. Thus, at the completion of rastering, the beam 30' has covered every portion of the substrate 16. The ion gun 18' shown in FIG. 3 can also be placed within a vacuum chamber (not shown) and supplied with a fluorine-containing or other halogenated sputtering gas (not shown), or in a halogen, such as fluorine, ambient within a vacuum chamber and supplied with an inert sputtering gas, similar to the embodiment shown in FIG. 2.

An ion gun apparatus producing a rastered ion beam may also be used in conjunction with a moving sample. The sample may be placed on a conveyor. A plurality of holders in series may each bring one substrate into a position where the substrate is contacted by the ion beam. In such a configuration, the ion beam may merely travel from side-to-side in one direction, while the conveyor provides the indexing motion of the substrates in the perpendicular direction to provide total coverage of the substrate.

For small substrates, the entire area to be treated can be irradiated by ions with a stationary substrate and a stationary ion beam. For larger substrates, however, it may be necessary to either move the ion irradiation over the area to be treated, such as by rastering a beam of ions as shown in FIG. 3, or to move the substrates through a stationary zone of treatment such as shown in FIG. 2.

Other ion generators may be used instead of ion guns. Ions can be produced in an electrical discharge or plasma, such as a fluorinated or otherwise halogenated plasma. The naturally occurring space charge sheath that develops at all surfaces in contact with the plasma may provide the necessary acceleration of these ions toward the solder surface. Because ions having the highest kinetic energy will generally strike the powered electrode of the plasma generator, it is beneficial to place the surface to be bombarded directly on the powered electrode. Such a preferred configuration is referred to as a reactive ion etching plasma. Placement elsewhere in the plasma may also be sufficient, however, to produce the desired effect.

Figure 4:
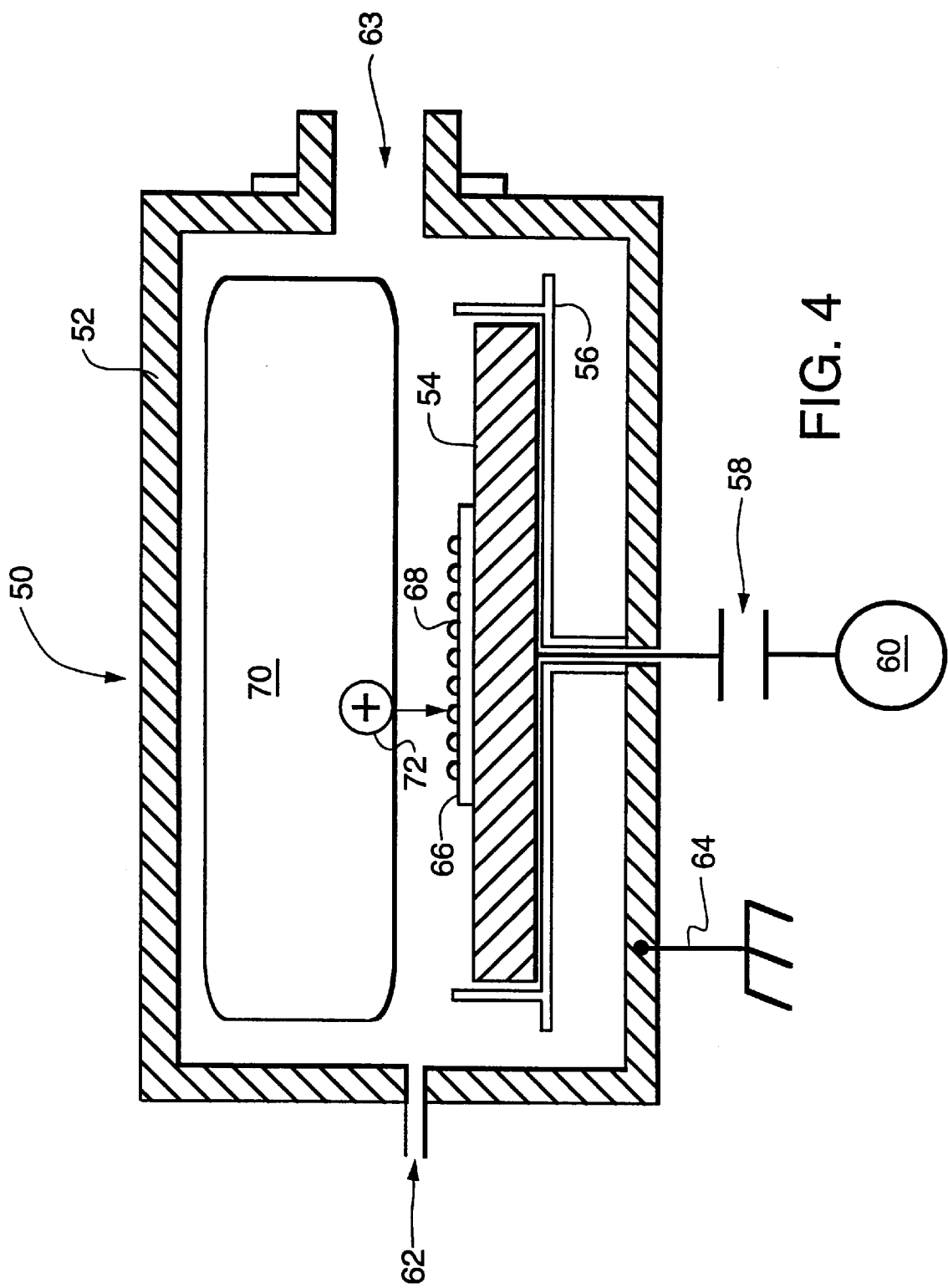
FIG. 4 is a side view schematic illustration of an exemplary reactive ion etching configuration for treating solder balls in accordance with the present invention.

Referring now to FIG. 4, there is shown an exemplary reactive ion etching configuration for treating an array of solder balls. Reactive ion etching system 50 comprises a vacuum chamber 52 in which lies an electrode 54 sitting inside a ground shield 56. Electrode 54 is electrically connected to a blocking capacitor 58 that is connected to a radio frequency (rf) source 60. Sputtering gas, for example a halogen such as fluorine, or a mixture of a halogen such as fluorine and an inert gas, enters the vacuum chamber 52 through a gas inlet 62, and vacuum is maintained in vacuum chamber 52 by connecting to a vacuum pump (not shown) which connects to chamber outlet 63. The vacuum chamber 52 is biased to ground 64.

To treat a substrate 66 containing an array of solder balls 68, the substrate 66 is placed on electrode 54. Vacuum chamber 52 is evacuated through chamber outlet 63 by the vacuum pump until a desired pressure is reached in the vacuum chamber 52. Sputtering gas enters through gas inlet 62. The radio frequency generated by rf source 60 is carried through electrode 54 and excites the gas above the electrode 54, creating plasma 70. Charged ions 72 from the plasma 70 are drawn toward electrode 54, and thus impinge upon solder balls 68 on substrate 66, creating the desired surface treatment as described with reference to FIG. 1B.

In addition to use with Sn-Pb alloys, the present invention may also be used with ternary alloys that contain Sn, Pb, and a third component such as silver (Ag). The process and resulting structure of the present invention may also be extended to alloys comprising metals other than Sn and Pb. In addition, although this invention may be most beneficial for use with high melt-temperature solder alloys (high Pb concentrations), the present invention is applicable to low melt-temperature solder alloys (lower Pb concentrations).

EXAMPLE

The following example is included to more clearly demonstrate the overall nature of the invention. This example is exemplary, not restrictive, of the invention.

Solder balls comprising 90% lead and 10% tin by weight and having a diameter of 0.76 mm (0.030 inches) were treated in a reactive ion etching configuration in a vacuum chamber evacuated to 350 mTorr. A plasma was generated using carbon tetrafluoride ($CF_4$) at a flow rate of 70 standard cubic centimeters per minute and a 300 Watt power source with 13.56 MHz frequency applied at the cathode, resulting in 0.45 Watts/$cm^2$ coverage of the sample. The resulting plasma had an average peak-to-peak ($V_{pp}$) energy of 600 Volts and a self-bias or DC-offset ($V_{dc}$) of 60 Volts, meaning that the solder balls were exposed to bombardment by ions having kinetic energies up to 480 eV. The solder balls were treated for approximately 1 minute.

Following treatment, the treated solder balls were placed in a glass dish such that each ball was in physical contact with at least one other ball. The temperature of solder balls was increased and monitored. The fluorine-plasma-treated balls melted and joined to form a single mass of material at a temperature of roughly 180° C. Untreated solder balls placed under similar heating conditions did not yield any joining at temperatures up to 300° C., the maximum temperature used in this experiment. No flux was used on either set of solder balls during the heating step.

Although illustrated and described above with reference to certain specific embodiments, the present invention is nevertheless not intended to be limited to the details shown. Rather, various modifications may be made in the details within the scope and range of equivalents of the claims and without departing from the spirit of the invention.

What is claimed is:

1. A process for promoting soldering of a mass of bulk solder having a bulk ratio of a first metal to a second metal, the process comprising:

exposing the bulk solder under vacuum to energized ions of a sputtering gas in the presence of a halogen for a predetermined time period; and thereby forming a surface layer having a desired depth and comprising a desired surface layer ratio of the first metal to the second metal that is less than the bulk ratio, the surface layer further comprising an uppermost surface film containing the halogen.

2. The process of claim 1 wherein the halogen is fluorine.

3. The process of claim 1 wherein the first metal is lead and the second metal is tin.

4. The process of claim 3 wherein the bulk ratio comprises at least approximately 90% mass concentration of lead.

5. The process of claim 4 wherein the bulk ratio comprises approximately 97% mass concentration of lead.

6. The process of claim 1 wherein the exposure to sputtering gas takes place in a halogen-containing ambient.

7. The process according to claim 6 wherein the sputtering gas comprises a noble gas.

8. The process according to claim 1 wherein the sputtering gas comprises a halogen gas.

9. The process according to claim 8 wherein the sputtering gas is a halogen-containing plasma.

10. The process according to claim 8 wherein the sputtering gas comprises fluorine.

11. The process according to claim 10 wherein the sputtering gas is a fluorine-containing plasma.

12. The process according to claim 11 wherein the exposure to a fluorine-containing plasma is in a reactive ion etching configuration.

13. The process according to claim 1 further comprising after the solder exposure and surface-layer forming steps, electrically joining the solder to a surface without using externally-applied flux.

14. The process according to claim 13 comprising performing the electrical joining step at a temperature of less than about 300° C.

15. The process according to claim 14 comprising performing the electrical joining step at a temperature of approximately 180° C.

16. A process for preparing a mass of lead-enriched bulk solder for soldering, comprising placing the bulk solder on an electrode of a reactive ion etching device and exposing the solder under vacuum to energized ions of a halogen-containing plasma.

17. The process according to claim 16 further comprising electrically joining the solder to a surface without using externally-applied flux.

18. The process of claim 16 wherein the halogen-containing plasma is a fluorine-containing plasma.

19. The process according to claim 18 further comprising electrically joining the solder to a surface without using externally-applied flux.

20. A process for preparing a mass of lead-enriched lead-tin bulk solder for soldering, comprising the steps of:

(a) placing the bulk solder on an electrode of a reactive ion etching device;

(b) exposing the solder under vacuum to energized ions of a fluorine-containing plasma; and (c) electrically joining the solder to a surface without using externally-applied flux.

* * * * *